United States Patent
Inamori

(10) Patent No.: US 8,278,834 B2
(45) Date of Patent: Oct. 2, 2012

(54) PWM CONTROL METHOD AND DEVICE AND LIGHT ADJUSTING DEVICE

(75) Inventor: Nobuya Inamori, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 228 days.

(21) Appl. No.: 12/739,504

(22) PCT Filed: Oct. 24, 2008

(86) PCT No.: PCT/JP2008/069361
§ 371 (c)(1),
(2), (4) Date: Apr. 23, 2010

(87) PCT Pub. No.: WO2009/054503
PCT Pub. Date: Apr. 30, 2009

(65) Prior Publication Data
US 2010/0253240 A1    Oct. 7, 2010

(30) Foreign Application Priority Data

Oct. 25, 2007  (JP) .................................. 2007-277733

(51) Int. Cl.
*H05B 41/16* (2006.01)
(52) U.S. Cl. .......................... 315/246; 315/360; 307/10.8
(58) Field of Classification Search .................... 315/77, 315/246, 291, 360; 307/10.1, 10.8
See application file for complete search history.

(56) References Cited

U.S. PATENT DOCUMENTS

| 5,710,465 | A  | * | 1/1998  | Saito et al. ................... 307/10.1 |
| 6,304,462 | B1 | * | 10/2001 | Balakrishnan et al. .... 363/21.01 |
| 6,313,976 | B1 | * | 11/2001 | Balakrishnan et al. ......... 361/79 |
| 6,351,398 | B1 | * | 2/2002  | Balakrishnan et al. .... 363/56.03 |
| 6,870,328 | B2 | * | 3/2005  | Tanabe et al. ................. 315/291 |
| 6,917,231 | B2 |   | 7/2005  | Terada et al. |
| 7,323,831 | B2 | * | 1/2008  | Norimatsu .................... 315/294 |
| 7,656,136 | B2 | * | 2/2010  | Chang .......................... 323/224 |

FOREIGN PATENT DOCUMENTS

| JP | 2000-177480 | 6/2000 |
| JP | 2004-32732  | 1/2004 |
| JP | 2006-32095  | 2/2006 |
| JP | 2006-121139 | 5/2006 |

* cited by examiner

*Primary Examiner* — Thuy Vinh Tran
(74) *Attorney, Agent, or Firm* — Gerald E. Hespos; Michael J. Porco

(57) ABSTRACT

A PWM control method increases/decreases a duty ratio of a PWM signal with a predetermined resolution so to control the duty ratio of the PWM signal in the case of a PWM control. The resolution of the duty ratio of the PWM signal is increased to make a high period in the duty ratio of the PWM signal longer than a rise time of the PWM signal if the high period is shorter than the rise time. The resolution of the duty ratio of the PWM signal is increased to make a low period in the duty ratio of the PWM signal longer than a fall time of the PWM signal if the low period is shorter than the fall time.

6 Claims, 18 Drawing Sheets

(a)

(b)

PWM CONTROL METHOD AND DEVICE AND LIGHT ADJUSTING DEVICE

BACKGROUND OF THE INVENTION

1. Field of the Invention

The present invention relates to PWM control method and device used in a vehicle-mounted electronic control unit and a light adjusting device.

2. Description of the Related Art

Conventionally, a PWM (Pulse Width Modulation) control has been widely known as means for dimming a lamp and adjusting a motor speed in a vehicle such as an automobile or a commercial vehicle (see, for example, Japanese Unexamined Patent Publication No. 2000-177480).

For example, in an electronic control unit (ECU) mounted in a vehicle such as an automobile, a microcomputer having a PWM output function is incorporated and a PWM control signal is generated and outputted for lamp dimming and motor speed adjustment control using a PWM signal outputted from the microcomputer. The ECU changes a duty ratio of the PWM control signal by changing a duty ratio (ratio of a high-level period to one cycle) of the PWM signal from the microcomputer, whereby the lamp dimming and motor speed adjustment of the vehicle can be performed with high accuracy. In the case of PWM controlling the lamp dimming of the vehicle, the lamp can be gradually turned up by gradually increasing the duty ratio of the PWM control signal and can be, conversely, gradually turned down by gradually decreasing the duty ratio as shown in FIG. 8.

As described above, in the case of PWM controlling the lamp dimming of the vehicle, the lamp is turned on or off by changing the duty ratio of the PWM control signal. On the other hand, in order to keep the lamp on with a specified luminance, the duty ratio of the PWM control signal needs to be maintained at a specified value. Here, if the frequency of the PWM control signal is excessively low as shown in FIG. 9(*a*), there is a problem in the case of a vehicle interior lamp or other cases that the flickering of lamp light attracts a driver's or passenger's attention and the driver or passenger visually recognizes the flickering.

Thus, in the case of controlling the light adjustment of the lamp such as the vehicle interior lamp, it is effective in light of reducing the flickering of the lamp light to more frequently switch the level of the PWM control signal between high level and low level by increasing the frequency of the PWM control signal as shown in FIG. 9(*b*).

It has been confirmed that noise is created in the ECU at the time of a PWM control if an AM radio is installed near the ECU having such a PWM output function as described above, and its causes include sudden current increase and decrease occurring in the ECU. In other words, in the ECU, a PWM signal from the microcomputer flows in a circuit in the ECU to generate a PWM control signal used for lamp dimming and the like. Due to the rectangular waveform of the PWM signal, the current generated in the circuit suddenly increases and decreases at the time of generating the PWM control signal. Such sudden increase and decrease of the current lead to an increase of high frequency components of the PWM control signal, with the result that noise is induced in the AM radio installed near the ECU.

Thus, generally, the above sudden increase and decrease of the current are moderated by dampening the rectangular waveform of the PWM signal from the microcomputer, whereby the increase of the high frequency components of the PWM control signal resulting from the sudden increase and decrease of the current is suppressed.

An object of the present invention is to provide technology capable of effectively suppressing noise generation in a PWM control as described above.

SUMMARY OF THE INVENTION

One aspect of the present invention is directed to a PWM control method for controlling a duty ratio of a PWM signal in the case of a PWM control by increasing and decreasing the duty ratio of the PWM signal at a specified resolution, characterized in that: the resolution of the duty ratio of the PWM signal is increased to make a high period in the duty ratio of the PWM signal longer than a rise time of the PWM signal if the high period is shorter than the rise time, and the resolution of the duty ratio of the PWM signal is increased to make a low period in the duty ratio of the PWM signal longer than a fall time of the PWM signal if the low period is shorter than the fall time.

Another aspect of the present invention is directed to a PWM control device, comprising: a generator for generating a PWM signal having a duty ratio which can be increased and decreased at a specified resolution, a setter for setting the duty ratio of the PWM signal, a transistor including a gate terminal and on/off operated by the application of the PWM signal to the gate terminal to generate a PWM control signal, and a capacitor arranged at an intermediate position between the generator and the gate terminal of the transistor for decreasing a time rate of change upon the rise and fall of the PWM signal, wherein the setter: increases the resolution of the duty ratio of the PWM signal to make a high period in the duty ratio of the PWM signal longer than a rise time of the PWM signal if the high period is shorter than the rise time, and increases the resolution of the duty ratio of the PWM signal to make a low period in the duty ratio of the PWM signal longer than a fall time of the PWM signal if the low period is shorter than the fall time.

Still another object of the present invention is directed to a light adjusting device, comprising: a lamp, and a PWM control device for feeding a PWM control signal to the lamp to controllably turn the lamp on and off, wherein the PWM control device includes: a generator for generating a PWM signal having a duty ratio which can be increased and decreased at a specified resolution, a setter for setting the duty ratio of the PWM signal, a transistor including a gate terminal and on/off operated by the application of the PWM signal to the gate terminal to generate a PWM control signal, and a capacitor arranged at an intermediate position between the generator and the gate terminal of the transistor for decreasing a time rate of change upon the rise and fall of the PWM signal, wherein the setter: increases the resolution of the duty ratio of the PWM signal to make a high period in the duty ratio of the PWM signal longer than a rise time of the PWM signal at the start of dimming the lamp, and increases the resolution of the duty ratio of the PWM signal to make a low period in the duty ratio of the PWM signal longer than a fall time of the PWM signal immediately before the lamp is turned off.

In the case of a light adjustment control of a vehicle interior lamp or the like using a PWM control signal, the amount of dampening the shape of the PWM signal needs to be increased depending on the antenna sensitivity and installed position of an AM radio and also a frequency required for the PWM control signal and the like. As a result, the following new problem occurs. This is specifically described below. FIG. 18 is a diagram showing the construction of an electronic control unit (ECU) according to the prior art of the present invention. The CPU 100 of FIG. 18 has a PWM output function and can PWM control the dimming of a lamp 6.

The ECU 100 is provided with a microcomputer 1, a field effect transistor (FEF) 2, resistors 3, 4, and a capacitor 5 as shown in FIG. 18. The microcomputer 1 includes a PWM signal generator 11 and a duty ratio setter 12. The PWM signal generator 11 generates a PWM signal, and the duty ratio of the PWM signal generated by the PWM signal generator 11 is suitably set by the duty ratio setter 12, wherein a set value can be changed. The microcomputer 1 performs a switching operation of the FET 2 by outputting the PWM signal generated by the PWM signal generator 11 to a gate terminal of the FET 2. The ECU 100 generates a PWM control signal for PWM controlling the dimming of the lamp 6 by the switching operation of the FET 2 and outputs it to the lamp 6.

The FET 2 includes an nMOS transistor, and a drain terminal thereof is connected to one end of the lamp 6 and a source terminal thereof is grounded. The other end of the lamp 6 is connected to a specified power supply voltage +B such as a vehicle-mounted battery, and a current flows between the source terminal and the drain terminal of the FET 2 to supply the current to the lamp 6.

The gate terminal of the FET 2 is connected to the microcomputer 1 via the resistor 3, and the PWM signal is outputted to the gate terminal of the FET 2 from the microcomputer 1. The FET 2 can electrically connect the source terminal and the drain terminal to flow a current therebetween if a gate voltage applied to the gate terminal increases to or above a specified threshold value.

Specifically, if the PWM signal outputted from the microcomputer 1 is at high level, the FET 2 is turned on and the drain terminal thereof is connected to a ground voltage to be set to low level. In other words, the PWM control signal from the ECU 100 is set to low level and the current is supplied from the power supply voltage to the lamp 6.

On the other hand, if the PWM signal is at low level, the FET 2 is shut off and the drain voltage is kept at high level. In other words, the PWM control signal from the ECU 100 is at high level and no current is supplied from the power supply voltage to the lamp 6.

Accordingly, by adjusting the duty ratio of the PWM signal outputted from the microcomputer 1, an average amount of the current supplied to the lamp 6 can be changed, whereby the dimming of the lamp 6 can be controlled. Various devices can be used as the FET 2, but a MOSFET, which is inexpensive and has a relatively high voltage resistance, is preferably used as such. If a MOSFET is used, a good PWM control can be realized by following the on/off control of the PWM signal even at a high PWM frequency.

Further, in the ECU 100, the capacitor 5 is arranged in parallel with the FET 2 between the gate terminal of the FET 2 and the ground voltage. In other words, the capacitor 5 is connected between the microcomputer 1 and the gate terminal of the FET 2. Effects brought about by the arrangement of the capacitor 5 are briefly described below.

As described above, the microcomputer 1 generates the PWM signal having the duty ratio set by the duty ratio setter 12 using the PWM signal generator and outputs it to the gate terminal of the FET 2. The PWM signal is a rectangular pulse signal whose level cyclically changes between high level and low level as shown in FIG. 2(*a*). By the action of the capacitor 5, cyclical changes of the voltage at the rise and fall of the PWM signal are moderated. In other words, the change of the gate voltage of the FET 2 is moderated and, accordingly, the increase and decrease of the current between the source terminal and the drain terminal of the FET 2 are moderated, wherefore the increase of the high frequency components of the PWM control signal resulting from the sudden increase and decrease of the current is effectively suppressed.

FIGS. 2(*a*) and 2(*b*) show the waveform of the PWM signal at point A in FIG. 18, i.e. outputted to the gate terminal of the FET 2 in the case where the capacitor 5 is not arranged and in the case where the capacitor 5 is arranged, FIGS. 3(*a*) and 3(*b*) show the waveform of the PWM control signal at point B in FIG. 18, i.e. outputted from the ECU 100 in the case where the capacitor 5 is not arranged and in the case where the capacitor 5 is arranged.

If the rise and fall of the PWM signal are excessively dampened by the above action of the capacitor 5, there have been cases where the PWM control signal from the ECU 100 does not completely reach low level or high level to increase the high frequency components of the PWM control signal as shown in FIGS. 10(*a*) and 10(*b*). Accordingly, the ECU 100 performs the following processing. Here, conditions of the PWM signal generated by the PWM signal generator 11 are as follows.

| | |
|---|---|
| (1) PWM frequency: | 400 Hz |
| (2) PWM resolution: | 256 steps |
| (3) Dimming time: | 2 sec |
| (4) PWM signal dampened amount: | 20 μsec |

The PWM signal dampened amount in the above (4) depends on the capacitance value of the capacitor 5 and the resistance value of the resistor 4 in FIG. 18 and are defined as shown in FIGS. 4(*a*) and 4(*b*). FIG. 4(*a*) is an enlarged chart showing the waveform of the fall of the PWM signal and FIG. 4(*b*) is an enlarged chart showing the waveform of the rise of the PWM signal.

Under the above conditions of the PWM signal, i.e. (1) PWM frequency and (2) PWM resolution, a minimum high level period (or minimum low level period) t1 has the following value.

$$t1 = (1/400 \text{ Hz})/250 \text{ steps}$$

$$= 9.8 \text{ μsec}$$

In this case, if the duty ratio is gradually decreased from a state where the PWM control signal is constantly at high level (duty ratio is 100%), the decrease of the duty ratio (dimming) is started from the above minimum low level period t1. Under the above condition (4) PWM signal dampened amount of 20 μsec, the PWM signal cannot completely rise in the minimum low level period. Thus, as shown in FIG. 5(*a*), the PWM control signal does not completely reach low level at the start of the dimming.

Similarly, at the duty ratio immediately before the PWM control signal enters a state where it is constantly at low level (duty ratio is 0%) (immediately before the lamp is turned off), the high level period is the above minimum high level period t1, but the PWM signal cannot completely rise under the above condition (4) PWM signal dampened amount of 20 μsec. Thus, as shown in FIG. 5(*b*), the PWM control signal does not completely reach high level immediately before a state where the PWM control signal is constantly at low level (duty ratio is 0%). Therefore, in either case, the PWM control signal suddenly changes to increase the high frequency components thereof.

Such a state is continued for a period of 2 sec/256 steps=7.8 msec at the start of the dimming and immediately before the lamp is turned off under the above condition (3) Dimming time of 2 sec. During this period, noise is generated in the AM radio. If a station with poor reception sensitivity of the AM radio is being selected at this time, sounds uncomfortable to a listener of the AM radio are outputted from a speaker.

Specifically, as shown in FIG. 10(a), if the duty ratio is gradually decreased from the state where the PWM control signal is constantly at high level, the rise and fall of the PWM signal are delayed if the waveform of the PWM signal from the microcomputer is excessively dampened, and the PWM control signal does not completely reach low level at point C in FIG. 10(a). As a result, the high frequency components of the PWM control signal are increased, which leads to the generation of new noise. Thereafter, immediately before the state where the PWM control signal is constantly at low level as shown in FIG. 10(b) (point D shown in FIG. 10(b)), the PWM control signal does not completely reach high level this time. Therefore, the high frequency components of the PWM control signal are increased, and noise generation cannot be sufficiently suppressed similar to the above.

The object, features and advantages of the present invention will become more apparent from the following detailed description and the accompanying drawings.

DETAILED DESCRIPTION OF THE PREFERRED EMBODIMENT

Figure 1:
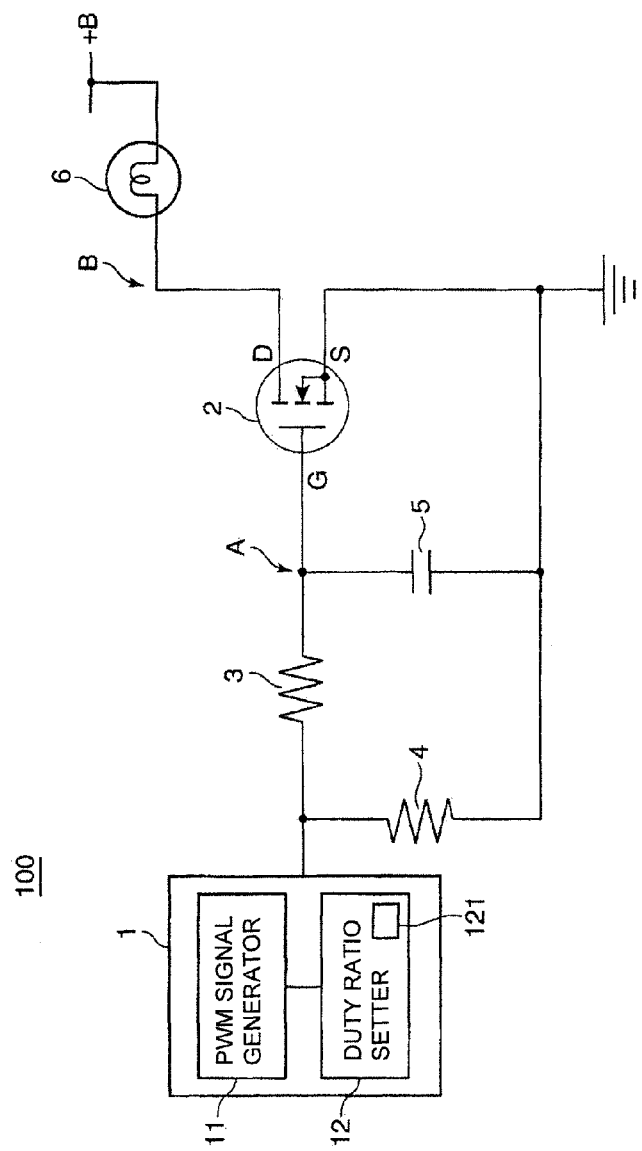
FIG. 1 is a diagram showing the construction of an electronic control unit according to one embodiment of the invention, FIG. 2 are charts showing the waveforms of a PWM signal at point A of FIG. 18, FIG. 3 are charts showing the waveforms of the PWM control signal at point B of FIG. 18, FIG. 4 are charts showing PWM signal dampened amounts, FIG. 5 are charts each showing a relationship of the PWM signal dampened amounts and a minimum low level period or a minimum high level period, FIG. 6 are charts showing the waveforms of the PWM control signal at point B of FIG. 18, FIG. 7 are charts showing the waveforms of the PWM control signal at point B of FIG. 18.
Figure 2:
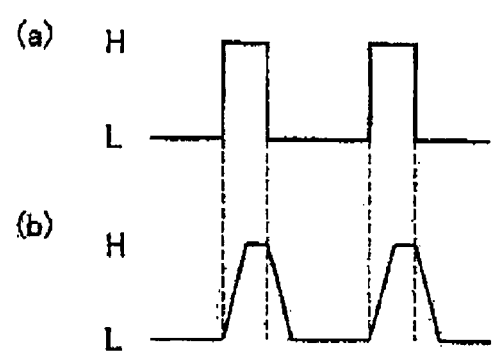
Figure 3:
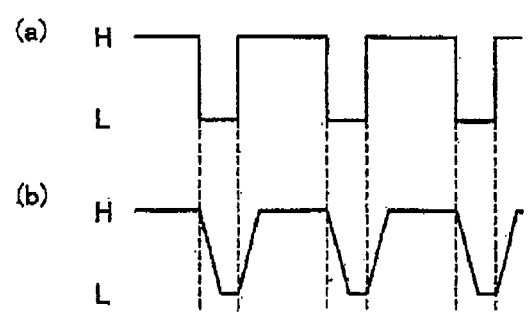
Figure 4:
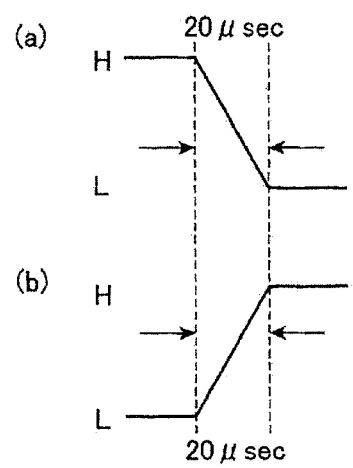
Figure 5:
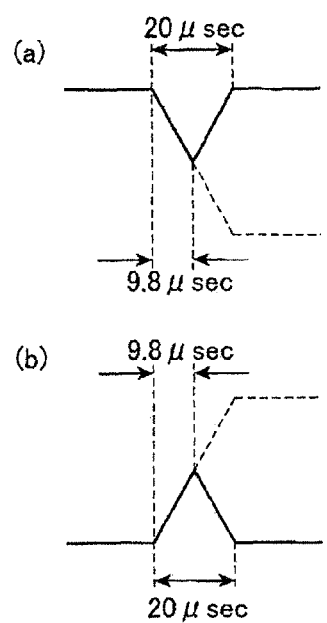

Hereinafter, one embodiment of the present invention is described with reference to the accompanying drawings. The same parts are identified by the same reference numerals and parts identified by the same reference numerals in the drawings may not be repeatedly described. FIG. 1 is a diagram showing the construction of an electronic control unit (ECU) according to the embodiment of the present invention. The ECU 100 of FIG. 1 has a PWM output function and can PWM control the dimming of a lamp 6.

The ECU 100 according to this embodiment is provided with a microcomputer 1, a field effect transistor (FET) 2, resistors 3 and 4, and a capacitor 5 as shown in FIG. 1. The microcomputer 1 includes a PWM signal generator 11 and a duty ratio setter 12. The PWM signal generator 11 generates a PWM signal, and the duty ratio of the PWM signal generated by the PWM signal generator 11 is suitably set by the duty ratio setter 12, wherein a set value can be changed. Further, a resolution changer 121, which is a characteristic feature of the present invention and capable of suitably changing the resolution of the duty ratio, is incorporated into the duty ratio setter 12, and changes and sets the resolution of the duty ratio according to needs.

The microcomputer 1 performs a switching operation of the FET 2 by outputting the PWM signal generated by the PWM signal generator 11 to a gate terminal of the FET 2. The ECU 100 generates a PWM control signal for PWM controlling the dimming of the lamp 6 by the switching operation of the FET 2 and outputs it to the lamp 6.

In this embodiment, the FET 2 includes an nMOS transistor, and a drain terminal thereof is connected to one end of the lamp 6 and a source terminal thereof is grounded. The other end of the lamp 6 is connected to a specified power supply voltage +B such as a vehicle-mounted battery, and a current flows between the source terminal and the drain terminal of the FET 2 to supply the current to the lamp 6.

The gate terminal of the FET 2 is connected to the microcomputer 1 via the resistor 3, and the PWM signal is outputted to the gate terminal of the FET 2 from the microcomputer 1. The FET 2 can electrically connect the source terminal and the drain terminal to flow a current therebetween if a gate voltage applied to the gate terminal increases to or above a specified threshold value.

Specifically, in this embodiment, if the PWM signal outputted from the microcomputer 1 is at high level, the FET 2 is turned on and the drain terminal thereof is connected to a ground voltage to be set to low level. In other words, the PWM control signal from the ECU 100 is set to low level and the current is supplied from the power supply voltage to the lamp 6.

On the other hand, if the PWM signal is at low level, the FET 2 is shut off and the drain voltage is kept at high level. In other words, the PWM control signal from the ECU 100 is set to high level and no current is supplied from the power supply voltage to the lamp 6.

Accordingly, by adjusting the duty ratio of the PWM signal outputted from the microcomputer 1, an average amount of the current supplied to the lamp 6 can be changed, whereby the dimming of the lamp 6 can be controlled. Various devices can be used as the FET 2, but a MOSFET, which is inexpensive and has a relatively high voltage resistance, is preferably used as such. If a MOSFET is used, a good PWM control can be realized by following the on/off control of the PWM signal even at a high PWM frequency.

Further, in the ECU 100 according to this embodiment, the capacitor 5 is arranged in parallel with the FET 2 between the gate terminal of the FET 2 and the ground voltage. In other words, the capacitor 5 is connected between the microcomputer 1 and the gate terminal of the FET 2.

Figure 10:
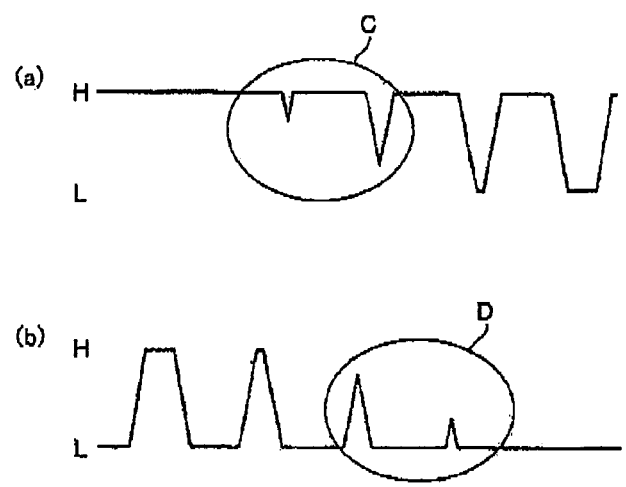

Next, the operation of the ECU according to this embodiment is further described. In the prior art of the present invention, if the rising and falling waveforms of the PWM signal are excessively dampened by the aforementioned action of the capacitor 5, there have been cases where the PWM control signal from the ECU 100 does not completely reach low level or high level as shown in FIGS. 10(a) and 10(b), leading to an increase of high frequency components of the PWM control signal. Accordingly, the ECU 100 according to this embodiment further performs a processing to be described below. In this case as well, conditions of the PWM signal generated by the PWM signal generator 11 are as follows.

| | |
|---|---|
| (1) PWM frequency: | 400 Hz |
| (2) PWM resolution: | 256 steps |
| (3) Dimming time: | 2 sec |
| (4) PWM signal dampened amount: | 201 μsec |

Figure 11:
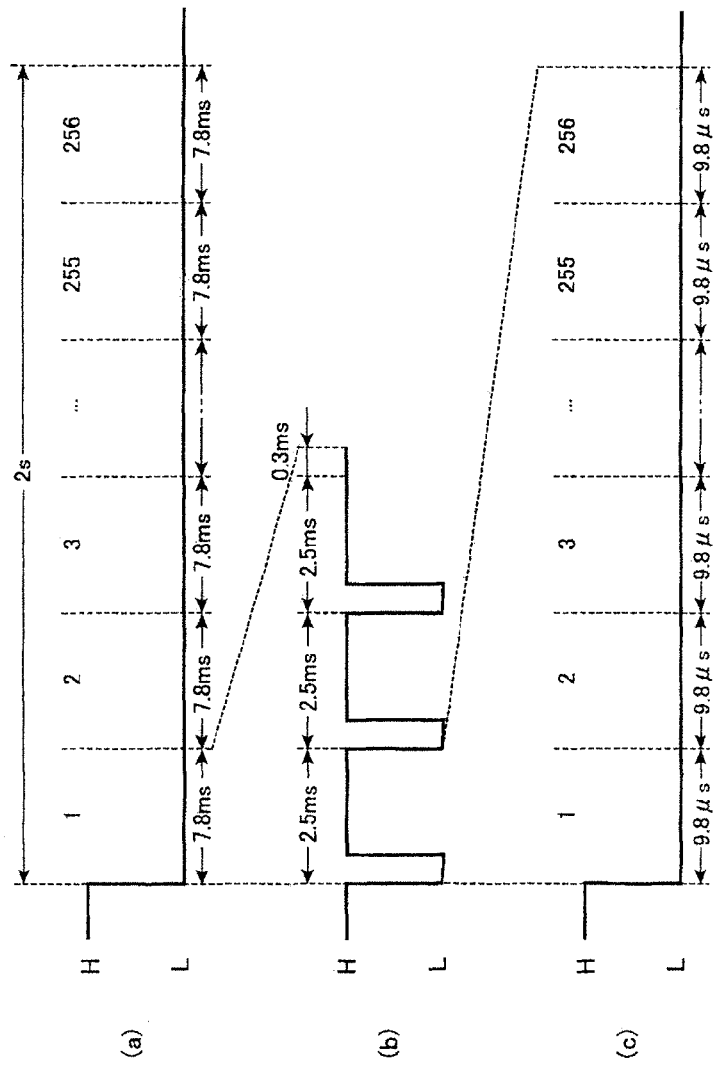

FIG. 11 are charts showing a relationship between the above condition (2) PWM resolution and the above condition (3) Dimming time. First of all, if the dimming time of 2 sec is divided by the PWM resolution of 256 steps, it results in 7.8 msec per resolution as shown in FIG. 11(a). On the other hand, since the above condition (1) PWM frequency is 400 Hz, a repeating cycle is 2.5 msec (1/400 Hz). Accordingly, as shown in FIG. 11(b), the repeating cycle of 2.5 msec is repeated three times within 7.8 msec per resolution with a remainder of 0.3 msec.

Here, the following methods may be, for example, employed as a method for handling the above remainder.

(a) With 7.5 msec per resolution set, the dimming time is changed to 1.9 sec (7.5 msec×256).

(b) With the repeating cycle set at 2.6 msec, the PWM frequency is changed to 385 Hz (1/0.0026).

For example, in the case of changing and adjusting the dimming time as in the above (a), if the repeating cycle of 2.5 msec is divided by the PWM resolution of 256 steps as shown in FIG. 11(c), it results in 9.8 μsec per resolution. In other words, under the above condition (1) PWM frequency and (2) PWM resolution, a minimum high level period (or minimum low level period) t1 has the following value.

$$t1 = (1/400 \text{ Hz})/250 \text{ steps}$$
$$= 9.8 \text{ μsec}$$

In this embodiment, by controlling the duty ratio of the PWM signal at the start of dimming the lamp and immediately before the lamp is turned off, the PWM control signal is made to reliably reach low level at the start of the dimming and is made to reliably reach high level immediately before the lamp is turned off. By doing so, an increase of high frequency components of the PWM control signal is suppressed to effectively suppress noise generation.

Figure 6:
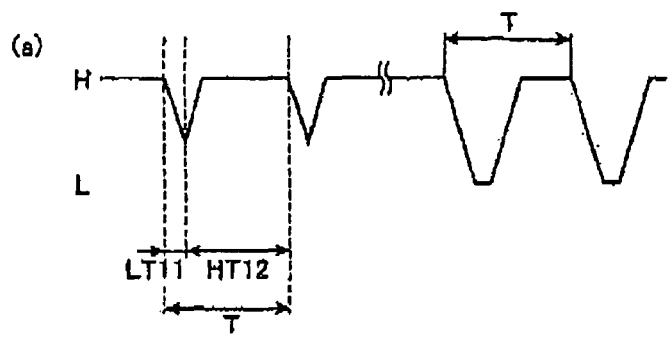
Figure 6:
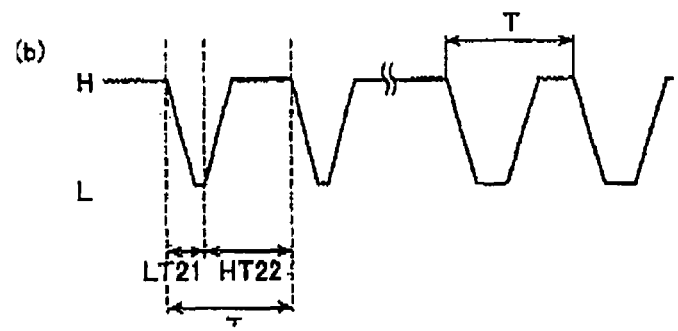

In a PWM control method according to this embodiment, a low level period of the duty ratio of the PWM signal at the start of the dimming is set to be longer than the above minimum low level period t1. Specifically, it is sufficient for the low level period at the start of the dimming to be longer than the PWM signal dampened amount of 20 μsec in the above condition (4). By setting the low level period in this way, the PWM signal can completely fall at the start of the dimming. Thus, the PWM control signal at the start of the dimming completely reaches low level. FIG. 6 diagrammatically show this point. Specifically, the PWM control signal that could not completely reach low level at a duty ratio defined by a low level period LT11 (minimum low level period t1) and a high level period HT12) at the start of the dimming as shown in FIG. 6(a), can completely reach low level by setting a duty ratio defined by a low level period LT21 (LT21>LT11) and a high level period HT22 (HT22<HT12) as shown in FIG. 6(b).

Figure 7:
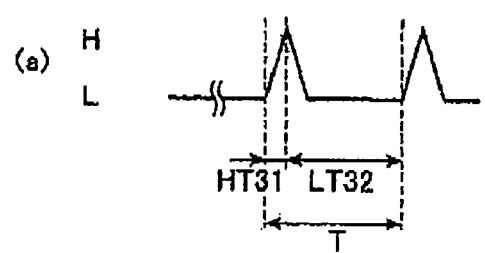
Figure 7:
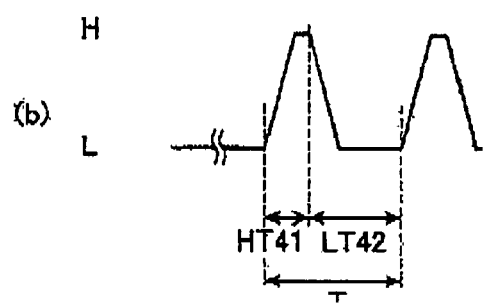
Figure 8:
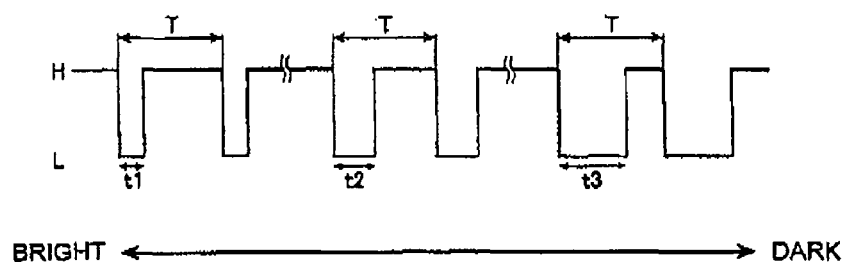
FIG. 8 is a chart showing the waveform of a conventional PWM control signal, FIG. 9 are charts showing the waveforms of conventional PWM control signals, FIG. 10 are charts showing the waveform of a conventional PWM control signal, FIG. 11 are charts showing a relationship of a PWM resolution and a dimming time, FIG. 12 are timing charts of the PWM signal and the PWM control signal at the start of dimming a lamp, FIG. 13 are timing charts of the PWM signal and the PWM control signal immediately before the lamp is turned off, FIG. 14 are timing charts of the PWM signal and the PWM control signal at the start of dimming the lamp, FIG. 15 are timing charts of the PWM signal and the PWM control signal immediately before the lamp is turned off, FIG. 16 are timing charts of the PWM signal and the PWM control signal at the start of dimming the lamp, FIG. 17 are timing charts of the PWM signal and the PWM control signal immediately before the lamp is turned off.
Figure 9:
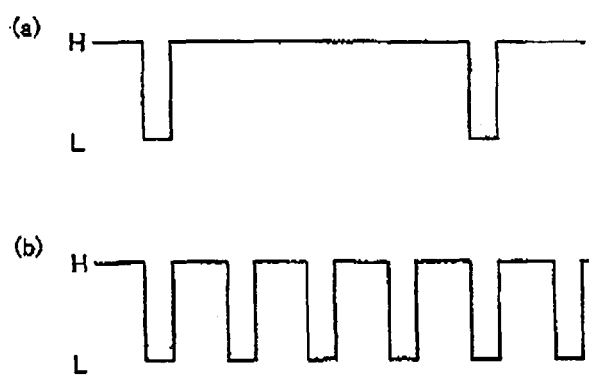

Similarly, in the PWM control method according to this embodiment, a high level period of the duty ratio of the PWM signal immediately before the lamp is turned off is set to be longer than the above minimum high level period t1. Specifically, it is sufficient for the high level period immediately before the lamp is turned off to be longer than the PWM signal dampened amount of 20 μsec in the above condition (4). By setting the high level period in this way, the PWM signal can completely rise immediately before the lamp is turned off. Thus, the PWM control signal immediately before the lamp is turned off completely reach high level. FIG. 7 diagrammatically show this point. Specifically, the PWM control signal that could not completely reach high level at a duty ratio defined by a high level period HT31 (minimum high level period t1) and a low level period LT32 immediately before the lamp is turned off as shown in FIG. 7(a), can completely reach high level by setting a duty ratio defined by a high level period HT41 (HT41>HT31) and a low level period LT42 (LT42<LT32) as shown in FIG. 7(b).

Next, the operation of the resolution changer 121 of this embodiment is specifically described. Here, the above processing method (b) is employed and the repeating cycle is set to 2.6 msec. Further, the above minimum high level period (or minimum low level period) t1 is set to 10 μsec.

Figure 12:
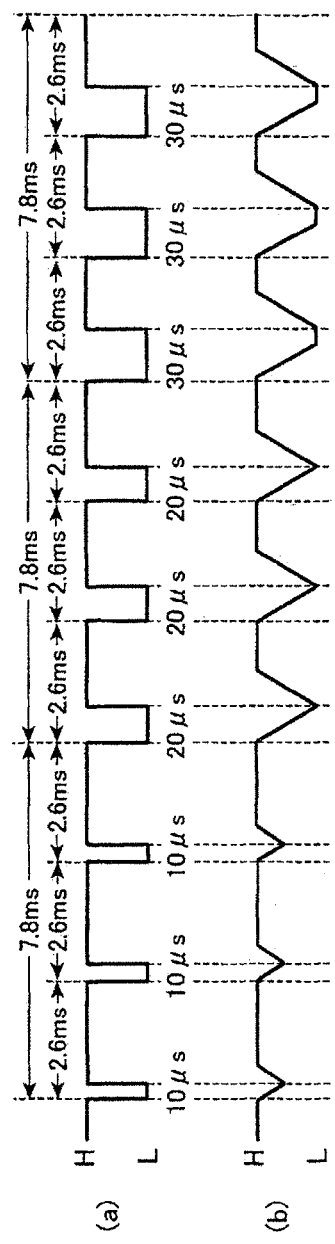
Figure 13:
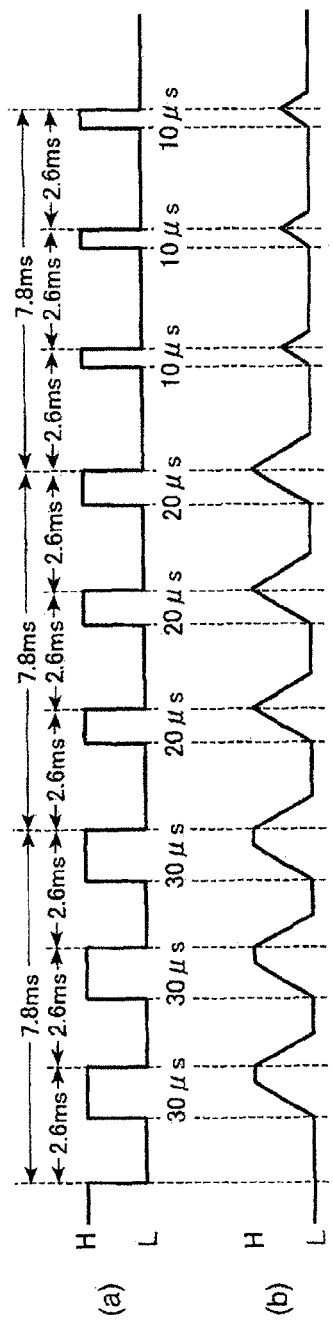

FIG. 12 are timing charts of the PWM signal and PWM control signal at the start of dimming the lamp when the resolution changer 121 is in an inoperative state, wherein (a) is the timing chart of the PWM signal and (b) is the timing of the PWM control signal. FIG. 13 are timing charts of the PWM signal and PWM control signal immediately before the lamp is turned off when the resolution changer 121 is in the inoperative state, wherein (a) is the timing chart of the PWM signal and (b) is the timing of the PWM control signal.

As shown in FIG. 12, in the first two steps at the start of the dimming, the PWM control signal does not completely fall to low level. Similarly, as shown in FIG. 13, in the last two steps immediately before the lamp is turned off, the PWM control signal does not completely rise to high level.

Figure 14:
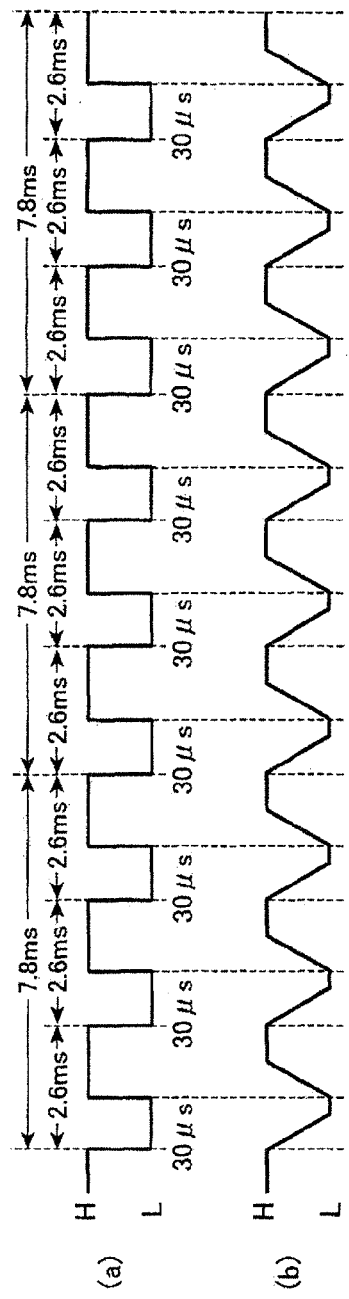
Figure 15:
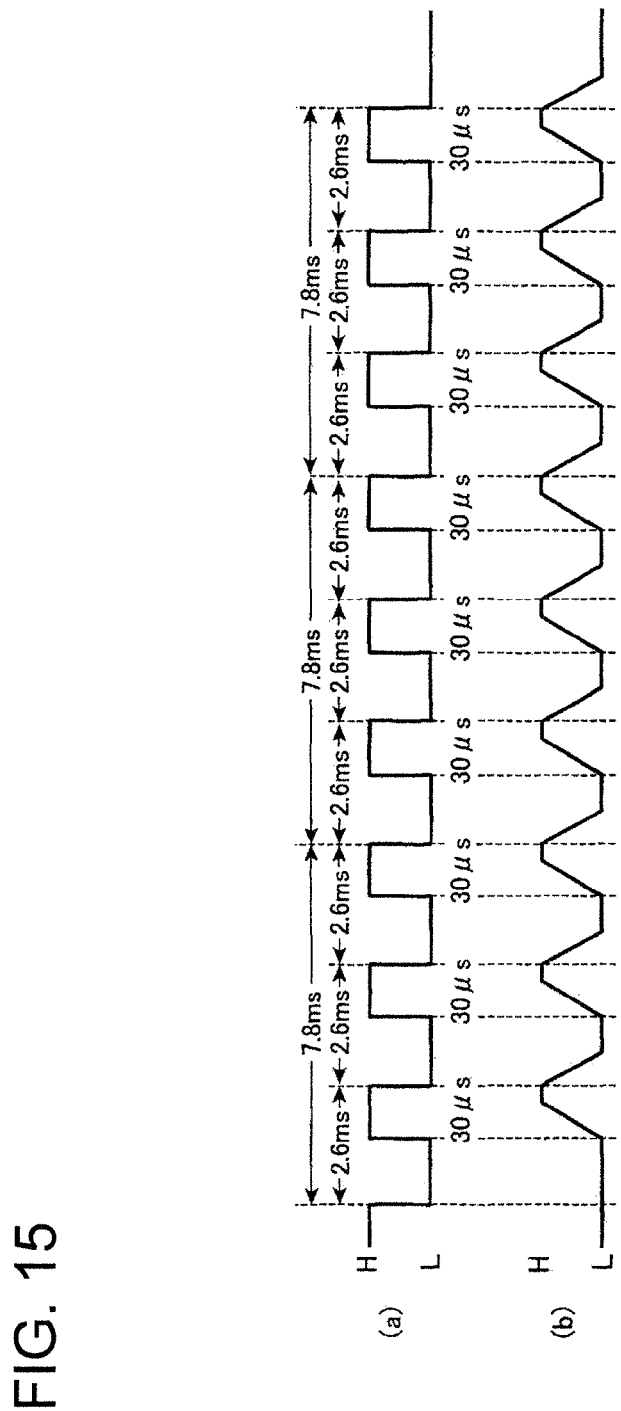

FIG. 14 are timing charts of the PWM signal and PWM control signal at the start of dimming the lamp when the resolution changer 121 is in an operative state, wherein (a) is the timing chart of the PWM signal and (b) is the timing of the PWM control signal. FIG. 15 are timing charts of the PWM signal and PWM control signal immediately before the lamp is turned off when the resolution changer 121 is in the operative state, wherein (a) is the timing chart of the PWM signal and (b) is the timing of the PWM control signal.

In the cases shown in FIGS. 14 and 15, the respective resolutions in the first two steps at the start of the dimming and in the last two steps immediately before the lamp is turned off are changed by the operation of the resolution changer 121, whereby the low level period and the high level period of the PWM signal are set to 30 μsec. By this resolution change, the PWM control signal completely falls to low level also in the first two steps at the start of the dimming as shown in FIG. 14 and, similarly, the PWM control signal completely rises to high level also in the last two steps immediately before the lamp is turned off as shown in FIG. 15.

Figure 16:
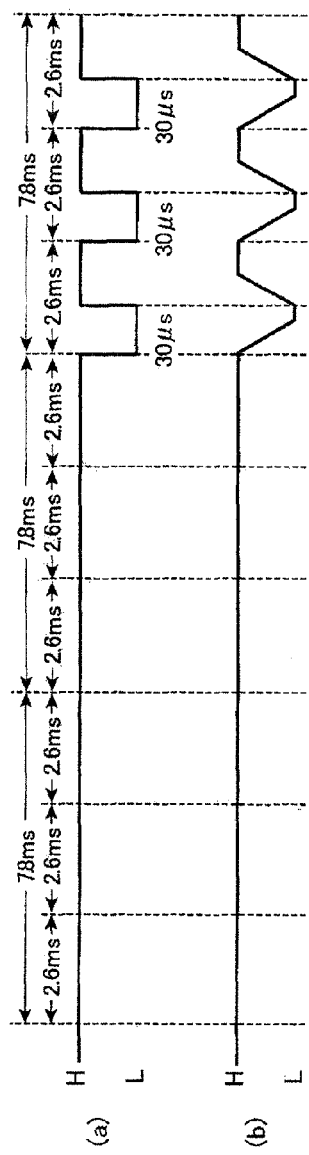
Figure 17:
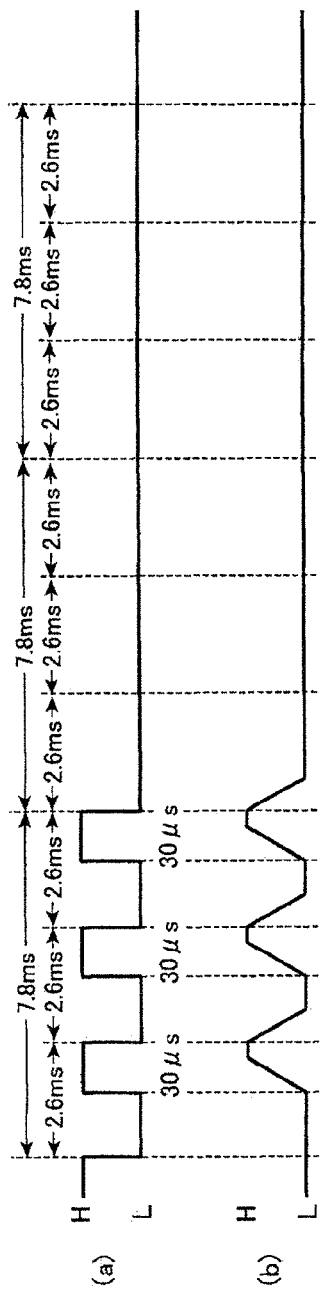
Figure 18:
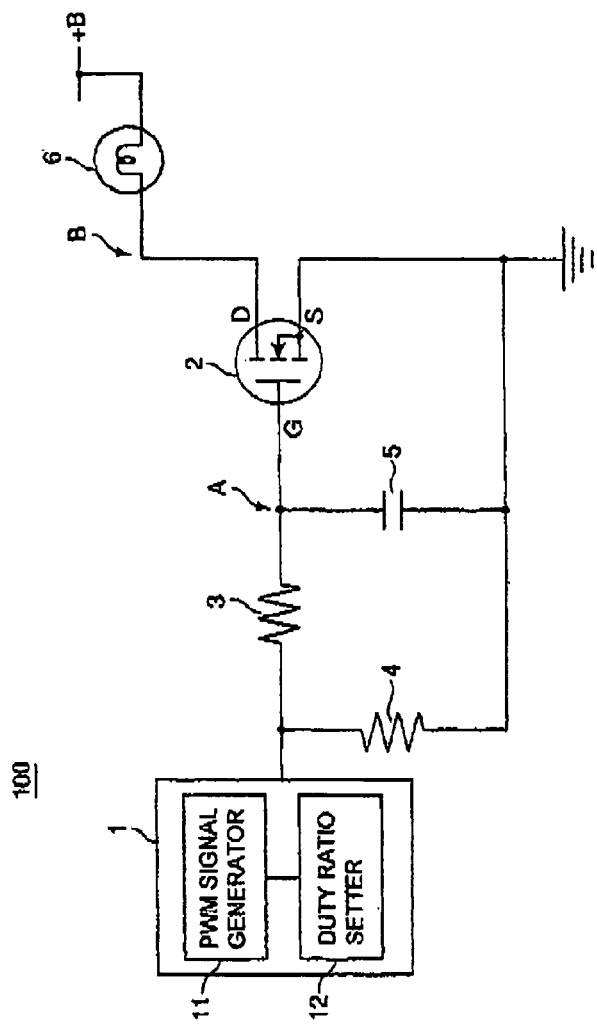
FIG. 18 is a diagram showing the construction of a conventional electronic control unit.

FIG. 16 are timing charts of the PWM signal and PWM control signal at the start of dimming the lamp when the resolution changer 121 is in the operative state, wherein (a) is the timing chart of the PWM signal and (b) is the timing of the PWM control signal. FIG. 17 are timing charts of the PWM signal and PWM control signal immediately before the lamp is turned off when the resolution changer 121 is in the operative state, wherein (a) is the timing chart of the PWM signal and (b) is the timing of the PWM control signal.

In the cases shown in FIGS. 16 and 17, the respective resolutions in the first two steps at the start of the dimming and in the last two steps immediately before the lamp is turned off are changed by the operation of the resolution changer 121, whereby the PWM signal is respectively locked at high level and low level. By this resolution change, the PWM control signal is locked at high level in the first two steps at the start of the dimming as shown in FIG. 16 and, similarly, the PWM control signal is locked at low level in the last two steps immediately before the lamp is turned off as shown in FIG. 17.

As described above, according to this embodiment, by controlling the duty ratio of the PWM signal at the start of the dimming and immediately before the lamp is turned off, the PWM control signal is made to reliably reach low level at the start of the dimming and is made to reliably reach high level immediately before the lamp is turned off. Thus, the increase of the high frequency components of the PWM signal can be suppressed to effectively suppress noise generation.

In this embodiment is described the control of the duty ratio of the PWM signal, in which the duty ratio is gradually decreased from a state where the PWM control signal is constantly at high level until reaching a state where the PWM control signal is constantly at low level (duty ratio is 0%). However, the present invention is not limited to this. The present invention is similarly applicable to a control of the duty ratio of the PWM signal, in which the duty ratio is gradually increased from a state where the PWM control signal is constantly at low level until reaching a state where the PWM control signal is constantly at high level.

The above specific embodiment mainly embraces inventions having the following constructions.

A PWM control method according to one aspect of the present invention is for controlling a duty ratio of a PWM signal in the case of a PWM control by increasing and decreasing the duty ratio of the PWM signal at a specified resolution and characterized in that the resolution of the duty ratio of the PWM signal is increased to make a high period in the duty ratio of the PWM signal longer than a rise time of the PWM signal if the high period is shorter than the rise time, and the resolution of the duty ratio of the PWM signal is increased to make a low period in the duty ratio of the PWM signal longer than a fall time of the PWM signal if the low period is shorter than the fall time.

In the above PWM control method, the PWM signal is controlled such that the resolution of the duty ratio of the PWM signal is increased to make the high period in the duty ratio of the PWM signal longer than the rise time of the PWM signal if the high period is shorter than the rise time and that the resolution of the duty ratio of the PWM signal is increased to make the low period in the duty ratio of the PWM signal longer than the fall time of the PWM signal if the low period is shorter than the fall time. Thus, the PWM signal reliably rises and falls. Here, even in the case of generating the PWM control signal by on/off operating the transistor by the application of the PWM signal, the transistor can be reliably on/off operated, wherefore high frequency components of the PWM control signal to be generated can be effectively suppressed.

The PWM signal may be locked at high level if the high period in the duty ratio of the PWM signal is shorter than the rise time of the PWM signal while being locked at low level if the low period in the duty ratio of the PWM signal is shorter than the fall time of the PWM signal.

In this case, even in the case of generating the PWM control signal by on/off operating the transistor by the application of the PWM signal, the transistor can be more reliably on/off operated.

A PWM control device according to another aspect of the present invention comprises a generator for generating a PWM signal having a duty ratio which can be increased and decreased at a specified resolution, a setter for setting the duty ratio of the PWM signal, a transistor including a gate terminal and on/off operated by the application of the PWM signal to the gate terminal to generate a PWM control signal, and a capacitor arranged at an intermediate position between the generator and the gate terminal of the transistor for decreasing a time rate of change upon the rise and fall of the PWM signal, wherein the setter increases the resolution of the duty ratio of the PWM signal to make a high period in the duty ratio of the PWM signal longer than a rise time of the PWM signal if the high period is shorter than the rise time, and increases the resolution of the duty ratio of the PWM signal to make a low period in the duty ratio of the PWM signal longer than a fall time of the PWM signal if the low period is shorter than the fall time.

In the above PWM control device, the PWM signal is controlled such that the resolution of the duty ratio of the PWM signal is increased to make the high period in the duty ratio of the PWM signal longer than the rise time of the PWM signal if the high period is shorter than the rise time and that the resolution of the duty ratio of the PWM signal is increased to make the low period in the duty ratio of the PWM signal longer than the fall time of the PWM signal if the low period is shorter than the fall time. Thus, the PWM signal reliably rises and falls. As a result, the transistor, to which the PWM signal is applied, can be reliably on/off operated, wherefore high frequency components of the PWM control signal generated by the on/off operation of the transistor can be effectively suppressed.

The setter may lock the PWM signal at high level if the high period in the duty ratio of the PWM signal is shorter than the rise time of the PWM signal while locking the PWM signal at low level if the low period in the duty ratio of the PWM signal is shorter than the fall time of the PWM signal.

In this case, the transistor, to which the PWM signal is applied, can be reliably on/off operated, wherefore high frequency components of the PWM control signal generated by the on/off operation of the transistor can be effectively suppressed.

A light adjusting device according to still another aspect of the present invention comprises a lamp, and a PWM control device for feeding a PWM control signal to the lamp to controllably turn the lamp on and off, wherein the PWM control device includes a generator for generating a PWM signal having a duty ratio which can be increased and decreased at a specified resolution, a setter for setting the duty ratio of the PWM signal, a transistor including a gate terminal and on/off operated by the application of the PWM signal to the gate terminal to generate a PWM control signal, and a capacitor arranged at an intermediate position between the generator and the gate terminal of the transistor for decreasing a time rate of change upon the rise and fall of the PWM signal, wherein the setter increases the resolution of the duty ratio of the PWM signal to make a high period in the duty ratio of the PWM signal longer than a rise time of the PWM signal at the start of dimming the lamp, and increases the resolution of the duty ratio of the PWM signal to make a low period in the duty ratio of the PWM signal longer than a fall time of the PWM signal immediately before the lamp is turned off.

In the above light adjusting device, the PWM signal is controlled such that the resolution of the duty ratio of the PWM signal is increased to make the high period in the duty ratio of the PWM signal longer than the rise time of the PWM signal at the start of dimming the lamp and that the resolution of the duty ratio of the PWM signal is increased to make the low period in the duty ratio of the PWM signal longer than the fall time of the PWM signal immediately before the lamp is turned off. Thus, the PWM signal reliably rises and falls. As a result, the transistor, to which the PWM signal is applied, can be reliably on/off operated, wherefore high frequency components of the PWM control signal generated by the on/off operation of the transistor can be effectively suppressed. Hence, by feeding such a PWM control signal to the lamp, the flickering of lamp light can be suppressed. In the case of, e.g. a vehicle interior lamp, a problem that a passenger or driver visually recognizes such flickering can be solved.

The setter may lock the PWM signal at high level at the start of dimming the lamp while locking the PWM signal at low level immediately before the lamp is turned off.

In this case, the transistor, to which the PWM signal is applied, can be reliably on/off operated, wherefore high frequency components of the PWM control signal generated by the on/off operation of the transistor can be effectively suppressed.

According to the present invention described above, there can be provided PWM control method and device and a light adjusting device capable of effectively suppressing noise generation.

The embodiment of the present invention disclosed this time is illustrative, but not restrictive. The scope of the present invention is indicated not by the disclosed content, but by claims and is intended to include all changes within the scope of the present invention and within the meaning and scope of equivalents.

What is claimed is:

1. A PWM control method for controlling a duty ratio of a PWM signal in the case of a PWM control by increasing and decreasing the duty ratio of the PWM signal at a specified resolution, characterized in that:
    the resolution of the duty ratio of the PWM signal is increased to make a high period in the duty ratio of the PWM signal longer than a rise time of the PWM signal if the high period is shorter than the rise time, and
    the resolution of the duty ratio of the PWM signal is increased to make a low period in the duty ratio of the PWM signal longer than a fall time of the PWM signal if the low period is shorter than the fall time.

2. A PWM control method according to claim 1, wherein the PWM signal is locked at high level if the high period in the duty ratio of the PWM signal is shorter than the rise time of the PWM signal while being locked at low level if the low period in the duty ratio of the PWM signal is shorter than the fall time of the PWM signal.

3. A PWM control device, comprising:
    a generator for generating a PWM signal having a duty ratio which can be increased and decreased at a specified resolution,
    a setter for setting the duty ratio of the PWM signal,
    a transistor including a gate terminal and on/off operated by the application of the PWM signal to the gate terminal to generate a PWM control signal, and
    a capacitor arranged at an intermediate position between the generator and the gate terminal of the transistor for decreasing a time rate of change upon the rise and fall of the PWM signal,
    wherein the setter:
    increases the resolution of the duty ratio of the PWM signal to make a high period in the duty ratio of the PWM signal longer than a rise time of the PWM signal if the high period is shorter than the rise time, and
    increases the resolution of the duty ratio of the PWM signal to make a low period in the duty ratio of the PWM signal longer than a fall time of the PWM signal if the low period is shorter than the fall time.

4. A PWM control device according to claim 3, wherein the setter locks the PWM signal at high level if the high period in the duty ratio of the PWM signal is shorter than the rise time of the PWM signal while locking the PWM signal at low level if the low period in the duty ratio of the PWM signal is shorter than the fall time of the PWM signal.

5. A light adjusting device, comprising:
    a lamp, and
    a PWM control device for feeding a PWM control signal to the lamp to controllably turn the lamp on and off,
    wherein the PWM control device includes:
        a generator for generating a PWM signal having a duty ratio which can be increased and decreased at a specified resolution,
        a setter for setting the duty ratio of the PWM signal,
        a transistor including a gate terminal and on/off operated by the application of the PWM signal to the gate terminal to generate a PWM control signal, and
        a capacitor arranged at an intermediate position between the generator and the gate terminal of the transistor for decreasing a time rate of change upon the rise and fall of the PWM signal,
    wherein the setter:
    increases the resolution of the duty ratio of the PWM signal to make a high period in the duty ratio of the PWM signal longer than a rise time of the PWM signal at the start of dimming the lamp, and
    increases the resolution of the duty ratio of the PWM signal to make a low period in the duty ratio of the PWM signal longer than a fall time of the PWM signal immediately before the lamp is turned off.

6. A light adjusting device according to claim 5, wherein the setter locks the PWM signal at high level at the start of dimming the lamp while locking the PWM signal at low level immediately before the lamp is turned off.

* * * * *